United States Patent
Marsh et al.

(10) Patent No.: US 7,989,290 B2
(45) Date of Patent: Aug. 2, 2011

(54) METHODS FOR FORMING RHODIUM-BASED CHARGE TRAPS AND APPARATUS INCLUDING RHODIUM-BASED CHARGE TRAPS

(75) Inventors: Eugene P. Marsh, Boise, ID (US); Brenda D Kraus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 12/408,920

(22) Filed: Mar. 23, 2009

(65) Prior Publication Data
US 2009/0173991 A1 Jul. 9, 2009

Related U.S. Application Data

(63) Continuation-in-part of application No. 11/197,184, filed on Aug. 4, 2005, now Pat. No. 7,575,978.

(51) Int. Cl.
*H01L 21/336* (2006.01)
(52) U.S. Cl. .......... 438/260; 257/E21.179; 257/E21.422
(58) Field of Classification Search .................. 257/325, 257/E21.179, E21.422; 438/257–267
See application file for complete search history.

(56) References Cited

U.S. PATENT DOCUMENTS

| | | |
|---|---|---|
| 5,119,329 A | 6/1992 | Evans et al. |
| 5,149,596 A | 9/1992 | Smith et al. |
| 5,223,001 A | 6/1993 | Saeki |
| 5,304,622 A | 4/1994 | Ikai et al. |
| 5,434,878 A | 7/1995 | Lawandy |
| 5,455,489 A | 10/1995 | Bhargava |
| 5,516,588 A | 5/1996 | van den Berg et al. |
| 5,585,020 A | 12/1996 | Becker et al. |
| 5,652,061 A | 7/1997 | Jeng et al. |
| 5,662,834 A | 9/1997 | Schulz et al. |
| 5,770,022 A | 6/1998 | Chang et al. |
| 5,772,760 A | 6/1998 | Gruen et al. |
| 5,851,880 A | 12/1998 | Ikegami |
| 5,874,134 A | 2/1999 | Rao et al. |
| 5,882,779 A | 3/1999 | Lawandy |
| 5,923,056 A | 7/1999 | Lee et al. |
| 5,939,146 A | 8/1999 | Lavernia |
| 5,962,132 A | 10/1999 | Chang et al. |
| 5,989,511 A | 11/1999 | Gruen et al. |

(Continued)

FOREIGN PATENT DOCUMENTS

WO  WO 2006112793 A1 * 10/2006

OTHER PUBLICATIONS

Hanafi, H.I., et al. "Fast and Long Retention-Time Nano-Crystal Memory." IEEE Trans. Elect. Dev., vol. 43, No. 9 (Sep. 1996): pp. 1553-1558.*

(Continued)

*Primary Examiner* — Matthew W Such
(74) *Attorney, Agent, or Firm* — Schwegman, Lundberg & Woessner, P.A.

(57) ABSTRACT

Isolated conductive nanoparticles on a dielectric layer and methods of fabricating such isolated conductive nanoparticles provide charge traps in electronic structures for use in a wide range of electronic devices and systems. In an embodiment, conductive nanoparticles are deposited on a dielectric layer by a plasma-assisted deposition process such that each conductive nanoparticle is isolated from the other conductive nanoparticles to configure the conductive nanoparticles as charge traps.

30 Claims, 9 Drawing Sheets

U.S. PATENT DOCUMENTS

| | | | |
|---|---|---|---|
| 6,020,024 | A | 2/2000 | Maiti et al. |
| 6,020,243 | A | 2/2000 | Wallace et al. |
| 6,025,034 | A | 2/2000 | Strutt et al. |
| 6,075,691 | A | 6/2000 | Duenas et al. |
| RE36,760 | E | 7/2000 | Bloomquist et al. |
| 6,129,928 | A | 10/2000 | Sarangapani et al. |
| 6,140,181 | A | 10/2000 | Forbes et al. |
| 6,146,976 | A | 11/2000 | Stecher et al. |
| H1924 | H | 12/2000 | Zabinski et al. |
| 6,184,550 | B1 | 2/2001 | Van Buskirk et al. |
| 6,208,881 | B1 | 3/2001 | Champeau |
| 6,218,293 | B1 | 4/2001 | Kraus et al. |
| 6,232,643 | B1 | 5/2001 | Forbes et al. |
| 6,246,606 | B1 | 6/2001 | Forbes et al. |
| 6,277,448 | B2 | 8/2001 | Strutt et al. |
| 6,313,015 | B1 | 11/2001 | Lee et al. |
| 6,313,035 | B1 | 11/2001 | Sandhu et al. |
| 6,323,081 | B1 | 11/2001 | Marsh |
| 6,323,511 | B1 | 11/2001 | Marsh |
| 6,331,282 | B1 | 12/2001 | Manthiram et al. |
| 6,342,445 | B1 | 1/2002 | Marsh |
| 6,351,411 | B2 | 2/2002 | Forbes et al. |
| 6,365,519 | B2 | 4/2002 | Kraus et al. |
| 6,392,257 | B1 | 5/2002 | Ramdani et al. |
| 6,395,650 | B1 | 5/2002 | Callegari et al. |
| 6,403,414 | B2 | 6/2002 | Marsh |
| 6,407,435 | B1 | 6/2002 | Ma et al. |
| 6,414,543 | B1 | 7/2002 | Beigel et al. |
| 6,447,764 | B1 | 9/2002 | Bayer et al. |
| 6,447,848 | B1 | 9/2002 | Chow et al. |
| 6,448,601 | B1 | 9/2002 | Forbes et al. |
| 6,458,431 | B2 | 10/2002 | Hill et al. |
| 6,472,632 | B1 | 10/2002 | Peterson et al. |
| 6,495,458 | B2 | 12/2002 | Marsh |
| 6,496,034 | B2 | 12/2002 | Forbes et al. |
| 6,506,666 | B2 | 1/2003 | Marsh |
| 6,531,727 | B2 | 3/2003 | Forbes et al. |
| 6,541,280 | B2 | 4/2003 | Kaushik et al. |
| 6,545,314 | B2 | 4/2003 | Forbes et al. |
| 6,559,014 | B1 | 5/2003 | Jeon |
| 6,559,491 | B2 | 5/2003 | Forbes et al. |
| 6,566,147 | B2 | 5/2003 | Basceri et al. |
| 6,572,836 | B1 | 6/2003 | Schulz et al. |
| 6,580,124 | B1 | 6/2003 | Cleeves et al. |
| 6,586,785 | B2 | 7/2003 | Flagan et al. |
| 6,586,797 | B2 | 7/2003 | Forbes et al. |
| 6,587,408 | B1 | 7/2003 | Jacobson et al. |
| 6,592,839 | B2 | 7/2003 | Gruen et al. |
| 6,613,695 | B2 | 9/2003 | Pomarede et al. |
| 6,617,634 | B2 | 9/2003 | Marsh et al. |
| 6,638,575 | B1 | 10/2003 | Chen et al. |
| 6,639,268 | B2 | 10/2003 | Forbes et al. |
| 6,642,567 | B1 | 11/2003 | Marsh |
| 6,642,782 | B2 | 11/2003 | Beigel et al. |
| 6,645,569 | B2 | 11/2003 | Cramer et al. |
| 6,653,591 | B1 | 11/2003 | Peterson et al. |
| 6,656,792 | B2 | 12/2003 | Choi et al. |
| 6,656,835 | B2 | 12/2003 | Marsh et al. |
| 6,660,631 | B1 | 12/2003 | Marsh |
| 6,669,823 | B1 | 12/2003 | Sarkas et al. |
| 6,669,996 | B2 | 12/2003 | Ueno et al. |
| 6,673,701 | B1 | 1/2004 | Marsh et al. |
| 6,677,204 | B2 | 1/2004 | Cleeves et al. |
| 6,689,192 | B1 | 2/2004 | Phillips et al. |
| 6,723,606 | B2 | 4/2004 | Flagan et al. |
| 6,734,480 | B2 | 5/2004 | Chung et al. |
| 6,746,893 | B1 | 6/2004 | Forbes et al. |
| 6,753,567 | B2 | 6/2004 | Maria et al. |
| 6,754,108 | B2 | 6/2004 | Forbes |
| 6,755,886 | B2 | 6/2004 | Phillips et al. |
| 6,767,419 | B1 | 7/2004 | Branagan |
| 6,767,582 | B1 | 7/2004 | Elers |
| 6,784,101 | B1 | 8/2004 | Yu et al. |
| 6,787,122 | B2 | 9/2004 | Zhou |
| 6,801,415 | B2 | 10/2004 | Slaughter et al. |
| 6,804,136 | B2 | 10/2004 | Forbes |
| 6,815,781 | B2 | 11/2004 | Vyvoda et al. |
| 6,818,067 | B2 | 11/2004 | Doering et al. |
| 6,830,676 | B2 | 12/2004 | Deevi |
| 6,831,310 | B1 | 12/2004 | Mathew et al. |
| 6,839,280 | B1 | 1/2005 | Chindalore et al. |
| 6,842,370 | B2 | 1/2005 | Forbes |
| 6,844,319 | B1 | 1/2005 | Poelstra et al. |
| 6,853,587 | B2 | 2/2005 | Forbes |
| 6,863,933 | B2 | 3/2005 | Cramer et al. |
| 6,888,739 | B2 | 5/2005 | Forbes |
| 6,896,617 | B2 | 5/2005 | Daly |
| 6,917,112 | B2 | 7/2005 | Basceri et al. |
| 6,921,702 | B2 | 7/2005 | Ahn et al. |
| 6,933,225 | B2 | 8/2005 | Werkhoven et al. |
| 6,950,340 | B2 | 9/2005 | Bhattacharyya |
| 6,952,032 | B2 | 10/2005 | Forbes et al. |
| 6,955,968 | B2 | 10/2005 | Forbes et al. |
| 6,958,937 | B2 | 10/2005 | Forbes et al. |
| 6,963,103 | B2 | 11/2005 | Forbes |
| 6,982,230 | B2 | 1/2006 | Cabral, Jr. et al. |
| 7,012,297 | B2 | 3/2006 | Bhattacharyya |
| 7,019,351 | B2 | 3/2006 | Eppich et al. |
| 7,026,694 | B2 | 4/2006 | Ahn et al. |
| 7,042,043 | B2 | 5/2006 | Forbes et al. |
| 7,049,192 | B2 | 5/2006 | Ahn et al. |
| 7,068,544 | B2 | 6/2006 | Forbes et al. |
| 7,074,673 | B2 | 7/2006 | Forbes |
| 7,075,829 | B2 | 7/2006 | Forbes |
| 7,084,078 | B2 | 8/2006 | Ahn et al. |
| 7,087,954 | B2 | 8/2006 | Forbes |
| 7,112,494 | B2 | 9/2006 | Forbes |
| 7,112,841 | B2 | 9/2006 | Eldridge et al. |
| 7,129,553 | B2 | 10/2006 | Ahn et al. |
| 7,133,315 | B2 | 11/2006 | Forbes |
| 7,135,734 | B2 | 11/2006 | Eldridge et al. |
| 7,154,778 | B2 | 12/2006 | Forbes |
| 7,160,817 | B2 | 1/2007 | Marsh |
| 7,166,886 | B2 | 1/2007 | Forbes |
| 7,169,673 | B2 | 1/2007 | Ahn et al. |
| 7,187,587 | B2 | 3/2007 | Forbes |
| 7,192,824 | B2 | 3/2007 | Ahn et al. |
| 7,192,892 | B2 | 3/2007 | Ahn et al. |
| 7,195,999 | B2 | 3/2007 | Forbes et al. |
| 7,199,023 | B2 | 4/2007 | Ahn et al. |
| 7,205,218 | B2 | 4/2007 | Ahn et al. |
| 7,221,017 | B2 | 5/2007 | Forbes et al. |
| 7,221,586 | B2 | 5/2007 | Forbes et al. |
| 7,235,854 | B2 | 6/2007 | Ahn et al. |
| 7,250,338 | B2 | 7/2007 | Bhattacharyya |
| 7,257,022 | B2 | 8/2007 | Forbes |
| 7,274,067 | B2 | 9/2007 | Forbes |
| 7,279,413 | B2 | 10/2007 | Park et al. |
| 7,297,617 | B2 | 11/2007 | Farrar et al. |
| 7,301,221 | B2 | 11/2007 | Farrar et al. |
| 7,309,664 | B1 | 12/2007 | Marzolin et al. |
| 7,312,494 | B2 | 12/2007 | Ahn et al. |
| 7,326,980 | B2 | 2/2008 | Ahn et al. |
| 2002/0019116 | A1 | 2/2002 | Sandhu et al. |
| 2002/0019125 | A1 | 2/2002 | Juengling et al. |
| 2002/0037320 | A1 | 3/2002 | Denes et al. |
| 2002/0037603 | A1 | 3/2002 | Eldridge et al. |
| 2002/0046993 | A1 | 4/2002 | Peterson et al. |
| 2002/0119916 | A1 | 8/2002 | Hassan |
| 2002/0120297 | A1 | 8/2002 | Shadduck |
| 2002/0132374 | A1 | 9/2002 | Basceri et al. |
| 2002/0148566 | A1 | 10/2002 | Kitano et al. |
| 2002/0170671 | A1 | 11/2002 | Matsuhita et al. |
| 2002/0187091 | A1 | 12/2002 | Deevi |
| 2002/0190251 | A1 | 12/2002 | Kunitake et al. |
| 2002/0192366 | A1 | 12/2002 | Cramer et al. |
| 2002/0193040 | A1 | 12/2002 | Zhou |
| 2003/0003635 | A1 | 1/2003 | Paranjpe et al. |
| 2003/0008243 | A1 | 1/2003 | Ahn et al. |
| 2003/0030074 | A1 | 2/2003 | Walker et al. |
| 2003/0049900 | A1 | 3/2003 | Forbes et al. |
| 2003/0106490 | A1 | 6/2003 | Jallepally et al. |
| 2003/0107402 | A1 | 6/2003 | Forbes et al. |
| 2003/0108612 | A1 | 6/2003 | Xu et al. |
| 2003/0141560 | A1 | 7/2003 | Sun |
| 2003/0148577 | A1 | 8/2003 | Merkulov et al. |
| 2003/0152700 | A1 | 8/2003 | Asmussen et al. |

| | | | |
|---|---|---|---|
| 2003/0161782 A1 | 8/2003 | Kim | |
| 2003/0162587 A1 | 8/2003 | Tanamoto et al. | |
| 2003/0175411 A1 | 9/2003 | Kodas et al. | |
| 2003/0176049 A1 | 9/2003 | Hegde et al. | |
| 2003/0183306 A1 | 10/2003 | Hehmann et al. | |
| 2003/0183901 A1 | 10/2003 | Kanda et al. | |
| 2003/0185983 A1 | 10/2003 | Morfill et al. | |
| 2003/0196513 A1 | 10/2003 | Phillips et al. | |
| 2003/0207593 A1 | 11/2003 | Derderian et al. | |
| 2003/0218199 A1 | 11/2003 | Forbes et al. | |
| 2003/0230479 A1 | 12/2003 | Sarkas et al. | |
| 2003/0231992 A1 | 12/2003 | Sarkas et al. | |
| 2003/0234420 A1 | 12/2003 | Forbes | |
| 2003/0235066 A1 | 12/2003 | Forbes | |
| 2003/0235076 A1 | 12/2003 | Forbes | |
| 2003/0235961 A1 | 12/2003 | Metzner et al. | |
| 2004/0004247 A1 | 1/2004 | Forbes | |
| 2004/0009118 A1 | 1/2004 | Phillips et al. | |
| 2004/0014060 A1 | 1/2004 | Hoheisel et al. | |
| 2004/0023516 A1 | 2/2004 | Londergan et al. | |
| 2004/0032773 A1 | 2/2004 | Forbes | |
| 2004/0033701 A1 | 2/2004 | Ahn et al. | |
| 2004/0042128 A1 | 3/2004 | Slaughter et al. | |
| 2004/0045807 A1 | 3/2004 | Sarkas et al. | |
| 2004/0046130 A1 | 3/2004 | Rao et al. | |
| 2004/0051139 A1 | 3/2004 | Kanda et al. | |
| 2004/0055892 A1 | 3/2004 | Oh et al. | |
| 2004/0058385 A1 | 3/2004 | Abel et al. | |
| 2004/0065171 A1 | 4/2004 | Hearley et al. | |
| 2004/0110347 A1 | 6/2004 | Yamashita | |
| 2004/0126649 A1 | 7/2004 | Chen et al. | |
| 2004/0127001 A1 | 7/2004 | Colburn et al. | |
| 2004/0130951 A1 | 7/2004 | Forbes | |
| 2004/0131795 A1 | 7/2004 | Kuo et al. | |
| 2004/0131865 A1 | 7/2004 | Kim et al. | |
| 2004/0135951 A1 | 7/2004 | Stumbo et al. | |
| 2004/0135997 A1 | 7/2004 | Chan et al. | |
| 2004/0145001 A1 | 7/2004 | Kanda et al. | |
| 2004/0147098 A1 | 7/2004 | Mazen et al. | |
| 2004/0149759 A1 | 8/2004 | Moser et al. | |
| 2004/0158028 A1 | 8/2004 | Buhler | |
| 2004/0165412 A1 | 8/2004 | Forbes | |
| 2004/0202032 A1 | 10/2004 | Forbes | |
| 2004/0212426 A1 | 10/2004 | Beigel | |
| 2004/0219783 A1 | 11/2004 | Ahn et al. | |
| 2004/0224505 A1 | 11/2004 | Nguyen et al. | |
| 2004/0245085 A1 | 12/2004 | Srinivasan | |
| 2004/0258192 A1 | 12/2004 | Angeliu et al. | |
| 2004/0266107 A1 | 12/2004 | Chindalore et al. | |
| 2005/0007820 A1 | 1/2005 | Chindalore et al. | |
| 2005/0011748 A1 | 1/2005 | Beck et al. | |
| 2005/0019365 A1 | 1/2005 | Frauchiger et al. | |
| 2005/0019836 A1 | 1/2005 | Vogel et al. | |
| 2005/0023574 A1 | 2/2005 | Forbes et al. | |
| 2005/0023584 A1 | 2/2005 | Derderian et al. | |
| 2005/0023594 A1 | 2/2005 | Ahn et al. | |
| 2005/0026349 A1 | 2/2005 | Forbes et al. | |
| 2005/0026375 A1 | 2/2005 | Forbes | |
| 2005/0029547 A1 | 2/2005 | Ahn et al. | |
| 2005/0031785 A1 | 2/2005 | Carlisle et al. | |
| 2005/0035430 A1 | 2/2005 | Beigel | |
| 2005/0036370 A1 | 2/2005 | Forbes | |
| 2005/0037374 A1 | 2/2005 | Melker et al. | |
| 2005/0041455 A1 | 2/2005 | Beigel et al. | |
| 2005/0041503 A1 | 2/2005 | Chindalore et al. | |
| 2005/0048414 A1 | 3/2005 | Harnack et al. | |
| 2005/0048570 A1 | 3/2005 | Weber et al. | |
| 2005/0048796 A1 | 3/2005 | Numasawa et al. | |
| 2005/0053826 A1 | 3/2005 | Wang et al. | |
| 2005/0061785 A1 | 3/2005 | Schroder et al. | |
| 2005/0064185 A1 | 3/2005 | Buretea et al. | |
| 2005/0077519 A1 | 4/2005 | Ahn et al. | |
| 2005/0124174 A1 | 6/2005 | Ahn et al. | |
| 2005/0157549 A1 | 7/2005 | Mokhlesi et al. | |
| 2005/0169054 A1 | 8/2005 | Forbes | |
| 2005/0277256 A1 | 12/2005 | Ahn et al. | |
| 2006/0001151 A1 | 1/2006 | Ahn et al. | |
| 2006/0008966 A1 | 1/2006 | Forbes et al. | |
| 2006/0024975 A1 | 2/2006 | Ahn et al. | |
| 2006/0027882 A1 | 2/2006 | Mokhlesi | |
| 2006/0035405 A1 | 2/2006 | Park et al. | |
| 2006/0043504 A1 | 3/2006 | Ahn et al. | |
| 2006/0081911 A1* | 4/2006 | Batra et al. | 257/315 |
| 2006/0125030 A1 | 6/2006 | Ahn et al. | |
| 2006/0170032 A1 | 8/2006 | Bhattacharyya | |
| 2006/0176645 A1 | 8/2006 | Ahn et al. | |
| 2006/0177975 A1 | 8/2006 | Ahn et al. | |
| 2006/0183272 A1 | 8/2006 | Ahn et al. | |
| 2006/0189079 A1* | 8/2006 | Merchant et al. | 438/260 |
| 2006/0189154 A1 | 8/2006 | Ahn et al. | |
| 2006/0228868 A1 | 10/2006 | Ahn et al. | |
| 2006/0237764 A1 | 10/2006 | Ahn et al. | |
| 2006/0240626 A1 | 10/2006 | Forbes | |
| 2006/0246741 A1 | 11/2006 | Ahn et al. | |
| 2006/0252211 A1 | 11/2006 | Ahn et al. | |
| 2006/0258097 A1 | 11/2006 | Forbes et al. | |
| 2006/0261376 A1 | 11/2006 | Forbes et al. | |
| 2006/0261397 A1 | 11/2006 | Ahn et al. | |
| 2006/0263972 A1 | 11/2006 | Ahn et al. | |
| 2006/0263981 A1 | 11/2006 | Forbes | |
| 2006/0264064 A1 | 11/2006 | Ahn et al. | |
| 2006/0274580 A1 | 12/2006 | Forbes | |
| 2006/0284246 A1 | 12/2006 | Forbes et al. | |
| 2007/0020835 A1 | 1/2007 | Ahn et al. | |
| 2007/0047319 A1 | 3/2007 | Bhattacharyya | |
| 2007/0048953 A1 | 3/2007 | Gealy et al. | |
| 2007/0048989 A1 | 3/2007 | Ahn et al. | |
| 2007/0049023 A1 | 3/2007 | Ahn et al. | |
| 2007/0087563 A1 | 4/2007 | Ahn et al. | |
| 2007/0090441 A1 | 4/2007 | Ahn et al. | |
| 2007/0105313 A1 | 5/2007 | Forbes | |
| 2007/0111544 A1 | 5/2007 | Ahn | |
| 2007/0141832 A1 | 6/2007 | Farrar | |
| 2007/0178643 A1 | 8/2007 | Forbes et al. | |
| 2007/0187772 A1 | 8/2007 | Ahn et al. | |
| 2007/0187831 A1 | 8/2007 | Ahn et al. | |
| 2007/0234949 A1 | 10/2007 | Ahn et al. | |
| 2007/0254488 A1* | 11/2007 | Huotari et al. | 438/720 |
| 2008/0032424 A1 | 2/2008 | Ahn et al. | |
| 2008/0048225 A1 | 2/2008 | Ahn et al. | |
| 2008/0057659 A1 | 3/2008 | Forbes et al. | |
| 2008/0057690 A1 | 3/2008 | Forbes et al. | |
| 2008/0121969 A1* | 5/2008 | Sandhu et al. | 257/316 |
| 2009/0090952 A1* | 4/2009 | Olsen et al. | 257/314 |

OTHER PUBLICATIONS

Alers, G. B., et al., "Intermixing at the tantalum oxide/silicon interface in gate dielectric structures", Applied Physics Letters, 73(11), (Sep. 14, 1998),1517-1519.

Atanassova, E., et al., "Breakdown Fields and Conduction Mechanisms in thin Ta2O5 Layers on Si for high density DRAMs", Microelectronics Reliability, 42, (2002),157-173.

Dover, V., et al., "Deposition of Uniform Zr-Sn-Ti-O Films by On-Axis Reactive Sputtering", IEEE Electron Device Letters, vol. 19, No. 9, (Sep. 1998),329-331.

Forbes, Leonard, "Memory Utilizing Oxide-Conductor Nanolaminates", U.S. Appl. No. 11/496,196, filed Jul. 31, 2006.

Leskela, M, "ALD precursor chemistry: Evolution and future challenges", *Journal de Physique IV (Proceedings)*, 9(8), (Sep. 1999),837-852.

Sneh, Ofer, "Thin film atomic layer deposition equipment for semiconductor processing", *Thin Solid Films*, 402(1-2), (Jan. 2002),248-261.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Wilk, G. D., "High-k gate dielectrics: Current status and materials properties considerations", *Journal of Applied Physics*, 89(10), (May 2001),5243-5275.

* cited by examiner

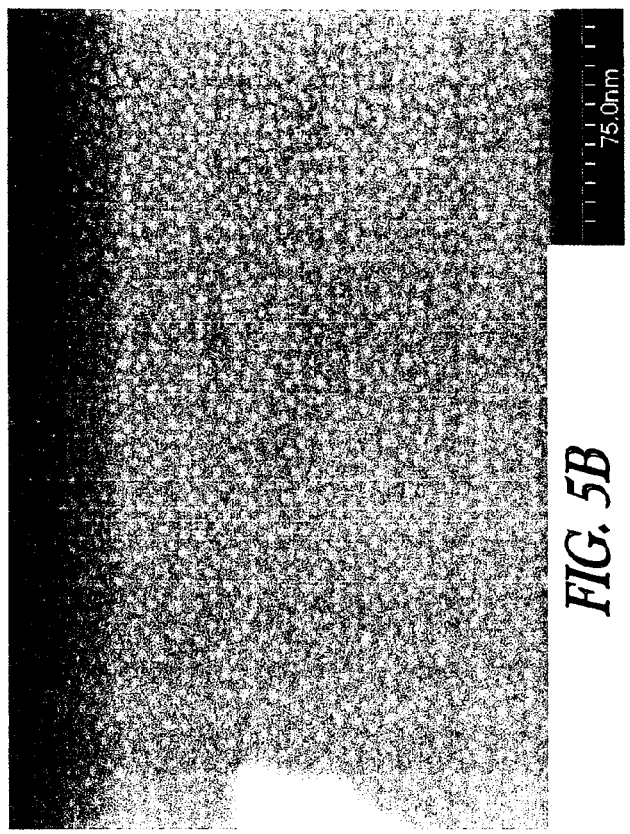
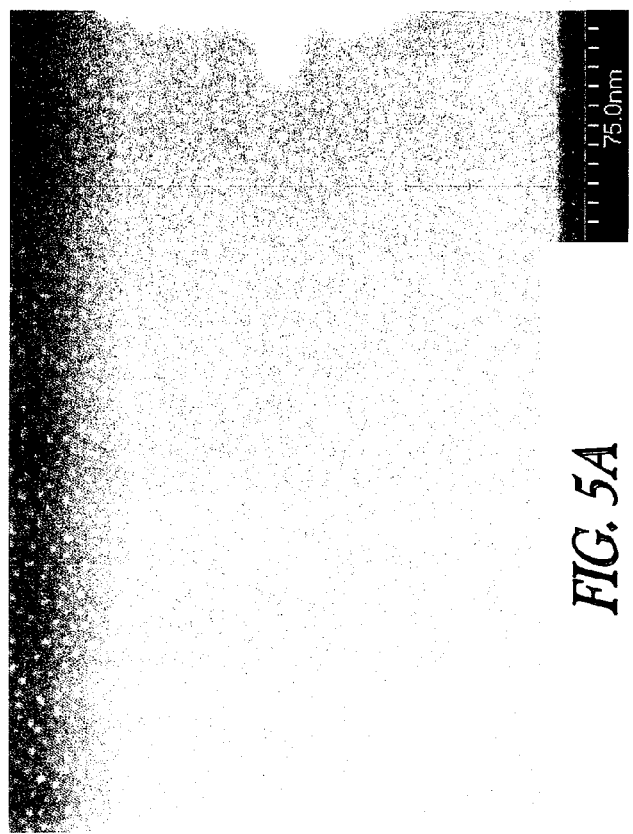
FIG. 5B
FIG. 5A

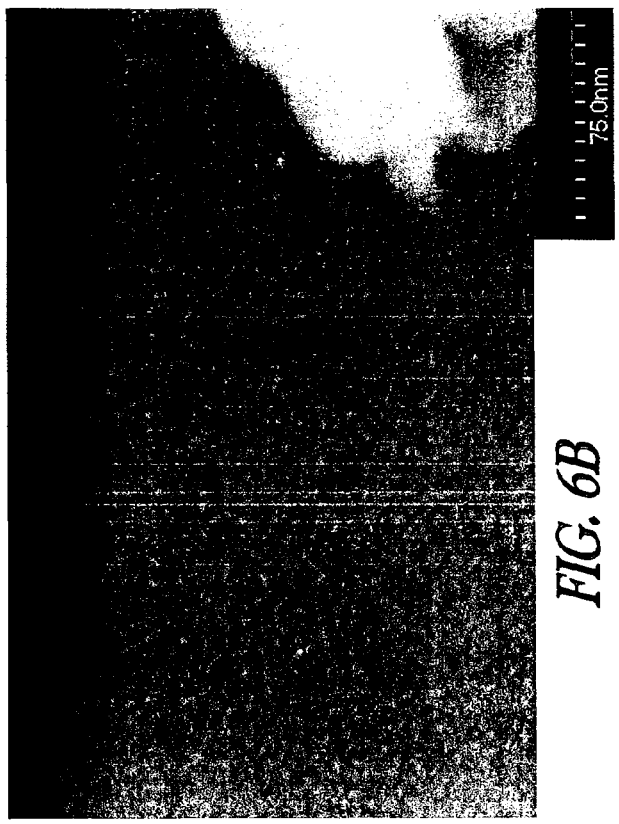
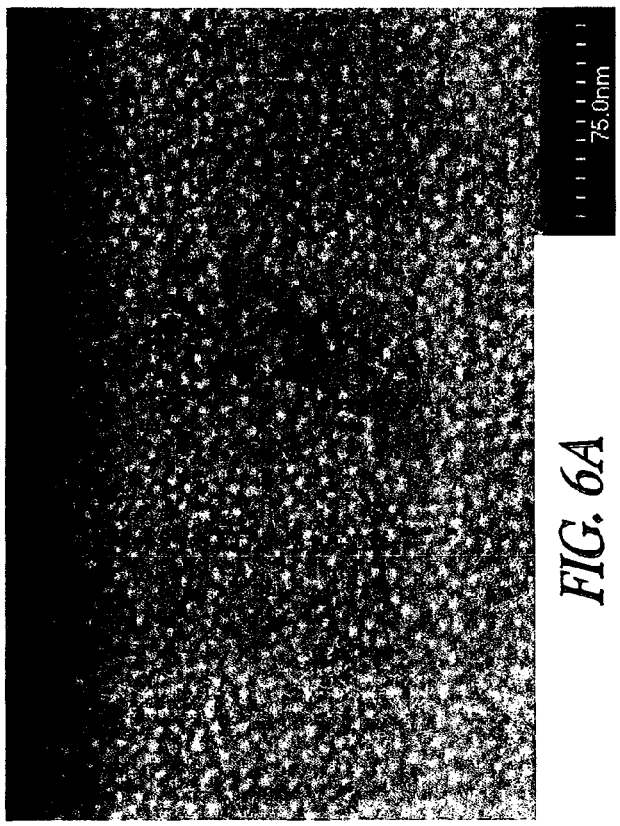

METHODS FOR FORMING RHODIUM-BASED CHARGE TRAPS AND APPARATUS INCLUDING RHODIUM-BASED CHARGE TRAPS

This application is a continuation-in-part application of commonly assigned application, Ser. No. 11/197,184, filed on 4 Aug. 2005 now U.S. Pat. No. 7,575,978, which is hereby incorporated by reference in its entirety.

TECHNICAL FIELD

This application relates generally to semiconductor devices and device fabrication.

BACKGROUND

Generation of higher capacity electronic devices and systems rely on scaling down device dimensions to realize higher density memory devices. However, associated with increased device density due to closer spacing is word line coupling within the higher density memories. Techniques are needed to reduce word line coupling, reduce programming voltages, and enable continued scaling of devices within a memory.

BRIEF DESCRIPTION OF THE DRAWINGS

Features of various embodiments of the invention are illustrated by way of example and not limitation in the figures of the accompanying drawings in which:

FIGS. 5A and 5B show SEM images of rhodium nanoparticles formed in a center region of deposition and formed at an edge of the deposition region, respectively, for a 5 second deposition.

FIGS. 6A and 6B show SEM images of rhodium nanoparticles formed in a center region of deposition and formed at an edge of the deposition region, respectively, for a 2 second deposition.

DETAILED DESCRIPTION

Figure 1:
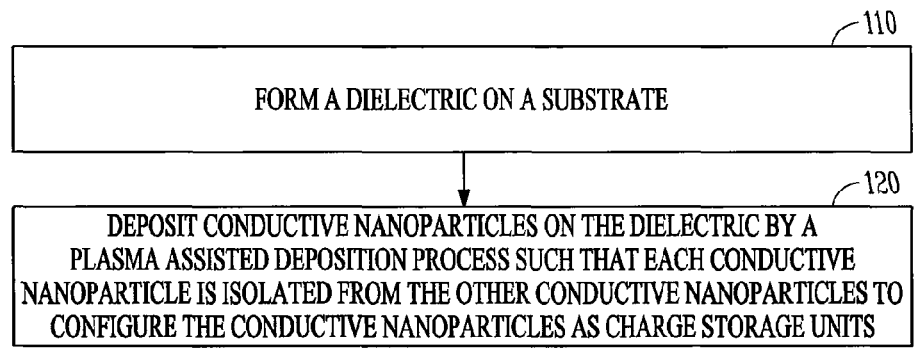
FIG. 1 depicts features of an embodiment of a method to form conductive nanoparticles on a dielectric layer to generate a charge storage layer.

The following detailed description refers to the accompanying drawings that show, by way of illustration, specific aspects and embodiments in which the present invention may be practiced. These embodiments are described in sufficient detail to enable those skilled in the art to practice the invention. Other embodiments may be utilized and structural, logical, and electrical changes may be made. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term "conductor" is understood to generally include n-type and p-type semiconductors and the term "insulator" or "dielectric" is defined to include any material that is less electrically conductive than the materials referred to as conductors.

The scaling of floating gates in non-volatile memories below 30 nm faces many challenges. As devices have become smaller, the spacing between floating gates may become sufficiently small such that the charge on the floating gate causes a threshold voltage ($V_t$) shift on adjacent gates resulting in degraded multi-level chip (MLC) operation. As scaling continues, this interference may increase until it becomes the same magnitude as the stored charge. Other limitations of scaling include data retention problems, program disturb, read disturb, erratic behavior, and others issues caused by damage to the tunnel oxide during cycling.

A Trap-based flash (TBF) device with discrete charge traps provides an option to address the scaling problems mentioned above. In these devices, charge is stored in discrete, individual locations. Therefore, reliability is improved because a charge loss defect will cause the loss of only those electrons associated with the trap center as opposed to all electrons stored on the gate. Due to electron localization, TBF can also reduce the interference between cells.

A trap-based flash can be constructed as a nanoparticle TBF. Herein, a nanoparticle includes a material structure whose effective diameter is measured in the nanometer range. A nanoparticle may also be referred to as a nanodot. A nanoparticle may have an effective diameter as large as 20 nanometers. Depending on the unit cell for a material, a nanoparticle of the material may include the material configured as a nanocrystal. A conductive nanoparticle is a material structured as a nanoparticle, where the material when structured in bulk form is conductive. These conductive nanoparticles are able to trap charges.

Not only do nanoparticles provide the TBF advantages listed above, they are also resistant to drain turn-on, have asymmetric conduction, field enhancement, and other parameters beneficial for non-volatile memory. It has been shown that a Ge nanoparticle memory provided greater than $10^6$ times larger retention-time to write-time ratio than conventional floating gate devices. Metal nanoparticles have a high density of states, which can provide superior performance characteristics relative to semiconductor-based nanoparticles. In various embodiments, the choice of metal can have a profound effect on the device characteristics.

An embodiment for a method of forming an electronic device includes forming a dielectric layer in an integrated circuit and forming conductive nanoparticles on the dielectric layer to generate a charge storage layer, in which each conductive nanoparticle is isolated from the other conductive nanoparticles. By isolated from the other conductive nanoparticles, it is meant spaced-apart with the absence of direct electrical conductivity. In an embodiment, conductive nanoparticles may be formed by a plasma-assisted deposition process. Embodiments of structures and methods for forming such structures provide for transistors, memory devices, and electronic systems having isolated conductive nanoparticles on a dielectric layer to store charge.

In various embodiments, a charge storage unit of an electronic device includes conductive nanoparticles on a dielectric layer, in which each conductive nanoparticle is isolated from the other conductive nanoparticles. The conductive nanoparticles can be deposited by plasma-assisted deposition techniques, which may include, but are not limited to, plasma-enhanced chemical vapor deposition (PECVD), plasma-enhanced atomic layer deposition (PEALD), and physical vapor deposition (PVD) that is plasma-enhanced. The application of a plasma may be used to roughen the deposited particles to form the nanoparticles. Further, the application of the plasma may provide for a higher density of conductive nanoparticles and improved adhesion for subsequent processing.

A charge storage unit may include a capping dielectric on the conductive nanoparticles with the conductive nanoparticles as charge storage elements. With the base dielectric layer sufficiently thin, charges may tunnel through the base dielectric layer and be trapped in the nanoparticles. The capping dielectric provides isolation from conductive elements such that the trapped charge may be stored, until an appropriate stimulus is provided to release the charge. In an embodiment, conductive nanoparticles may be used as a floating gate to replace the use of a polysilicon floating gate that is currently being used in flash memory. The isolated conductive nanoparticles may serve as a charge trapping layer to reduce programming voltage and to reduce word line coupling, as well as to enable continued scaling beyond that associated with the conventional floating gate structure.

FIG. 1 shows features of an embodiment of a method to form conductive nanoparticles on a dielectric layer to generate a charge storage unit. At 110, a dielectric layer is formed in an integrated circuit on a substrate. In an embodiment, the dielectric layer may be a silicon oxide layer. Alternatively, the dielectric layer may be a layer of one or more high-κ dielectric materials. High-κ materials include materials having a dielectric constant greater than silicon dioxide, for example, dielectric materials having a dielectric constant greater than about twice the dielectric constant of silicon dioxide. A set of high-κ dielectric may include, but is not limited to, $HfO_x$, $ZrO_x$, $TiO_x$, $TaO_x$, $AlO_x$, $LaAlO_x$, the lanthanide oxides, other metal oxides, and corresponding metal silicates. The dielectric layer may be a layer of an insulative nitride and/or insulative oxynitride. The dielectric layer may be structured as a dielectric stack having a number of layers of different dielectric material. The dielectric stack may be nanolaminate. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, the dielectric layer formed may be structured as a tunneling dielectric allowing the movement of charge through the dielectric under appropriate stimulation. In an embodiment, a tunneling dielectric may have a thickness of 30 Å or less.

At 120, conductive nanoparticles are deposited on the dielectric layer by a plasma assisted deposition process such that each conductive nanoparticle is isolated from the other conductive nanoparticles. The conductive nanoparticles are configured as isolated material islands forming charge storage units, which may be arranged as a charge storage layer. This charge storage layer may be covered by a top dielectric layer isolating the conductive nanoparticles, not only from each other, but from direct contact with a conductive medium. In an embodiment, the top dielectric layer may be of the same construction as the dielectric layer on which the conductive nanoparticles are deposited so as to effectively form one dielectric layer with conductive nanoparticles dispersed in the one dielectric layer. In an embodiment, the conductive nanoparticles are configured substantially in a plane on the dielectric layer. Alternatively, the conductive nanoparticles may be configured dispersed throughout a dielectric layer having at least a minimal distance from the bottom of the dielectric layer that is formed on a substrate.

In an embodiment, the size of the nanoparticles is increased by annealing to form isolated agglomerations of particles defining isolated enlarged islands of conductive material. In an embodiment, the size of the nanoparticles may be increased by a factor of about five. Enlargement by annealing is not limited to a factor of five, but may use other factors depending on the application. In an embodiment, a nanoparticle may have an effective or average diameter of about 2 nm that may be enlarged to about 10 nm by annealing. Nanoparticles are not limited to these dimensions, but may have other dimensions in various embodiments. The isolated conductive nanoparticles, either as discrete nanoparticles or enlarged islands of conductive nanoparticles, provide a means to reduce an effect associated with a defect that allows charge to leak through the dielectric on which the nanoparticles are formed. In a structure having isolated conductive nanoparticles, leakage may be localized to a few of these nanoparticles, reducing the amount of charge that may leak due to a defect, which may amount to only a few electrons.

In various embodiments, a capping dielectric can be formed on the isolated conductive nanoparticles. The capping dielectric can be disposed to fill the regions between the isolated conductive nanoparticles. The capping dielectric provides a top dielectric that may be of the same construction as the dielectric on which the conductive nanoparticles are deposited so as to effectively form one dielectric layer with the conductive nanoparticles dispersed in the one dielectric layer. In various embodiments, a dielectric, conductive nanoparticles on the formed dielectric, a capping dielectric on and contacting the formed conductive nanoparticles can be formed in a nanolaminate structure.

In an embodiment, conductive nanoparticles may be deposited by PECVD. In an embodiment, conductive nanoparticles may be deposited by PEALD. In an embodiment, conductive nanoparticles may be deposited by ALD followed by exposure to a plasma. In an embodiment, material may be deposited by ALD followed by exposing the material to a plasma to form nanoparticles. The material deposited by ALD may be in the form of nanoparticles, where the subsequent exposure to a plasma enhances the density of the nanoparticles. Herein, a process that includes atomic layer deposition followed by exposure to a plasma is referred to as plasma agglomerated atomic layer deposition or plasma agglomerated ALD. Though the exposure to a plasma in plasma agglomerated ALD may be post deposition with respect to a number of ALD deposition cycles, plasma agglomerated ALD is herein defined as a plasma-assisted deposition process. The flow of precursors in these plasma-assisted methods can be controlled to provide for the formation of isolated nanoparticles such that a uniform layer of the deposited material is not formed.

In various embodiments, conductive nanoparticles can be formed on substrates comprising silicon dioxide on single crystal, (100) oriented p-type silicon wafers. The process chamber for the formation of these nanoparticles can be configured to perform both atomic layer deposition (ALD) and plasma-enhanced chemical vapor deposition (PECVD) with processing tools that are automated and include a cassette chamber load lock and transfer chamber. The process chamber can be maintained at a base pressure, such as a base temperature of $1 \times 10^{-6}$ Torr, and can be configured with a capacitively coupled plasma (CCP) with a chuck-powered electrode, grounded showerhead, RF matching network, and a 13.56 MHz RF generator. Other configurations for process chambers can be used and other substrate materials can be used, such as high-κ dielectric materials on various base substrates that are not limited to silicon wafers.

In an embodiment, ruthenium (Ru) nanoparticles are deposited on a dielectric layer using plasma assisted chemical vapor deposition. A capping dielectric layer may be formed on the ruthenium nanoparticles to create a structure having charge traps to store charge. During processing subsequent to nanoparticle deposition, such as the formation of the capping dielectric layer, some of the ruthenium nanoparticles may oxidize. However, the oxidation may form conductive ruthenium oxide nanoparticles, which are applicable as conductive nanoparticles. Thus, selecting conductive nanoparticles that remain conductive on oxidation eases the constraints on subsequent processing.

In an example embodiment, ruthenium nanoparticles may be formed at a temperature of about 200° C. using a PECVD process. The processing wafer may be soaked in argon at 10 Torr for 2 minutes, after which a 30 second 200 sccm (standard cubic centimeters per minute) flow for 300 W Ar plasma may be conducted to stabilize the plasma. Then, a (1,3-cyclohexadiene)ruthenium $(C_6H_8)Ru(CO)_3$ reactant may be switched to the reactant chamber at the same time as the argon is turned off. The delivery lines to a showerhead, held at about 50° C., may be heated to about 62° C. A 500 sccm He carrier gas may be used. The reactants may be controlled to flow for about 2 seconds providing ruthenium nanoparticles with a density of approximately $4 \times 10^{12}/cm^2$ (100-110 nanocrystals/ 50 nm×50 nm area). Ruthenium nanoparticles can be formed using a PECVD process applying a $(C_6H_8)Ru(CO)_3$ reactant gas with a substrate holder heated to 300° C. and a 300 W plasma for 2 seconds. These are example embodiments; other embodiments are not limited to these precursors and process parameters.

In an embodiment, ruthenium nanoparticles deposited on a dielectric layer may be capped with a dielectric layer. In various embodiments, the dielectric layer may be a plasma-enhanced tetraethylorthosilicate (PE-TEOS), a silicon oxide in the form of a high density plasma (HDP) oxide, a silicon oxide in the form of a high temperature oxide (HTO), a low temperature ALD oxide, a high temperature (such as 600° C.) ALD oxide, or a combination of an ALD oxide between the ruthenium nanoparticles and one of the other dielectric layers. A capping dielectric layer may be characterized by the method used to form the capping dielectric layer. Charge storage units including a capping dielectric layer on ruthenium nanoparticles deposited on a dielectric layer may have a range of program erase (P/E) windows.

In an embodiment, platinum (Pt) nanoparticles may be deposited on a dielectric layer using plasma assisted chemical vapor deposition. In an example embodiment, platinum nanoparticles may be formed at a temperature of about 200° C. The processing wafer may be soaked in argon at 10 Torr for 2 minutes, after which a 30 second 200 sccm flow for 300 W Ar plasma may be conducted to stabilize the plasma. Then, $(CH_3)_3(CH_3C_5H_4)Pt$ and $O_2$ reactants may be switched to the reactant chamber at the same time as the argon is turned off. The delivery lines to a showerhead, held at about 50° C., may be heated to about 60° C. A 100 sccm He carrier gas may be used. The reactants may be controlled by flow for about 8 seconds providing platinum nanoparticles with a density of approximately $4 \times 10^{12}/cm^2$ (100-110 nanocrystals/50 nm×50 nm area). In various embodiments, platinum PECVD nanoparticles can be deposited using a PECVD process with (trimethyl)methylcyclopentadienyl-platinum $((CH_3)_3 (CH_3C_5H_4)Pt, Pt10)$ and $O_2$ and a substrate holder at 300° C. in a 60 W plasma for 8 seconds. These are example embodiments; other embodiments are not limited to these precursors and process parameters.

In an embodiment, platinum nanoparticles deposited on a dielectric layer may be capped with a dielectric layer. In various embodiments, the dielectric layer may be a PE-TEOS, a HDP oxide, a HTO oxide, a low temperature ALD oxide, a high temperature ALD oxide, or a combination of an ALD oxide between the platinum nanoparticles and one of the other dielectric layers. Structures including a capping dielectric layer on platinum nanoparticles deposited on a dielectric layer may have a range of P/E windows. In an embodiment, platinum nanoparticles on a dielectric layer with a top ALD oxide may provide a program/erase window of about 3.2 volts using 15V, 1 sec pulses with no degradation during subsequent cycles.

In an embodiment, platinum nanoparticles may be deposited on a dielectric layer using physical vapor deposition. The physical vapor deposition may be performed in short doses to provide the nanoparticles. A platinum sputter target may be exposed to an argon plasma for about 1-2 seconds to provide nanoparticles on a dielectric layer, where the nanoparticles are separated from each other. Other dosing periods may be used to provide spaced-apart platinum nanoparticles. PVD processing of platinum nanoparticles may be formed in a vacuum or at appropriately low pressures. In an embodiment, platinum nanoparticles may be processed by PVD at a pressure ranging from about $10^{-7}$ Torr to about $10^{-8}$ Torr. Other conductive elements and conductive combinations of elements may be used in a PVD process to provide spaced-apart conductive nanoparticles.

In an embodiment, platinum nanoparticles may be deposited on a dielectric layer using atomic layer deposition. Platinum nanoparticles can be deposited using thermal ALD with (trimethyl)methylcyclopentadienyl-platinum $((CH_3)_3 (CH_3C_5H_4)Pt, Pt10)$ and $O_2$ with a substrate holder heated to 320° C. for a variable number of cycles. Controlling nucleation sites for the platinum nanoparticles may provide spaced-apart platinum nanoparticles. The formation of the nanoparticles by ALD may be followed by other processes, such as plasma exposure, annealing, or combinations of post deposition processes, to enhance the density of the platinum nanoparticles.

In an embodiment, cobalt (Co) nanoparticles may be deposited on a dielectric layer using plasma agglomerated atomic layer deposition. ALD processing provides nucleation mechanism for generating the nanoparticles as isolated islands. A number of ALD cycles may be performed followed by exposure to a plasma for a given amount of time. An ALD cycle for depositing cobalt may consist of independently pulsing a cobalt-containing precursor, a purge gas, a reactant precursor, and another purge gas. Pulsing purge gases is performed to remove precursors and by-products from the reaction chamber after the precursors have been pulsed into the chamber for a specific time. For additional aid in removal of material, the purge pulse may be followed by evacuating the reaction chamber for a short period to pump out by-products and excess precursors.

In an example embodiment, cobalt nanoparticles may be formed at a substrate temperature of about 325° C. in an ALD reactant chamber with the showerhead held at about 50° C. The ALD cycle may include a 4 sec pulse of $CpCo(CO)_2$, where the cyclopentadienyl (Cp) ligand is a monoanionic ligand with the formula $C_5H_5$. The $CpCo(CO)_2$ pulse may be followed by a 5 sec Ar purge followed by a 60 sec evacuation pump. After the purge/pump for the cobalt-containing precursor, a 2 sec $NH_3$ reactant precursor may be pulsed followed by a 5 sec argon purge and a 10 sec evacuation pump to complete a cycle. In an embodiment, after conducting 10 cycles, the deposited material may be exposed to a 10 second 300 watt 300 sccm Ar plasma to form cobalt nanoparticles. In another example, cobalt nanoparticles can be formed using an ALD process with dicarbonylcyclopentadienylcobalt $(C_5H_5Co(CO)_2)$ and $NH_3$ with a substrate holder heated to 450° C. Following 10 ALD cycles, the film can be exposed to an in-situ 300 W Ar plasma to modify the Co layer into nanoparticles. These are example embodiments; other embodiments are not limited to these precursors and process parameters.

To form a charge storage unit, a capping dielectric may be formed on the cobalt nanoparticles. During the capping process or in subsequent processing, some cobalt nanoparticles may oxidize eliminating such structures as conductive nanoparticles. Processing at low temperatures may aid in reducing the amount of cobalt nanoparticles that oxidize. Further, choice of dielectrics used in the charge storage unit may aid in reducing the amount of the cobalt nanoparticles that oxidize. Using dielectrics that do not contain oxygen, such as silicon nitride, may reduce any tendency for cobalt nanoparticles to oxidize. Alternatively, silicon oxide may be used for a tunneling oxide and a capping oxide with a barrier, or liner, layer between the cobalt nanoparticles and these oxides. Metal oxides may be used in which the metal oxygen bonding is structurally preferred such that cobalt nanoparticles do not oxidize as the metal oxide is formed on the cobalt nanoparticles.

In an embodiment, rhodium (Rh) nanoparticles can be deposited using PECVD with dicarbonylcyclopentadienyl-rhodium $((C_5H_5)Rh(CO)_2)$. The $(C_5H_5)Rh(CO)_2$ can be maintained in a gas source at room temperature. The gas lines in the reaction chamber for the reactant precursors can be maintained at room temperature with a substrate holder at 300° C. in a 60 W plasma for deposition time in the range of 2-10 seconds. A He carrier gas at 20 sccm and a 300 sccm $O_2$ reactant gas can be applied to the reaction chamber having a pressure at approximately 46 mtorr. Rhodium nanoparticles can be deposited using virtually the same parameters used in forming Pt nanoparticles but with lower carrier gas flow and no heating of the metal-containing precursor or input lines that may be used in forming platinum nanoparticles.

In various embodiments, conductive rhodium-based nanoparticles are formed as part of an electronic device by a method that includes forming a dielectric layer in an integrated circuit on a substrate and forming the conductive rhodium-based nanoparticles on the formed dielectric layer, where the rhodium-based nanoparticles are formed by a plasma-assisted deposition process. The rhodium-based nanoparticles are deposited such that each conductive rhodium-based nanoparticle is isolated from the other conductive rhodium-based nanoparticles. A capping dielectric layer can be formed on and contacting the formed conductive rhodium-based nanoparticles. The capping dielectric layer can be formed of the same material composition as the dielectric layer. The capping dielectric layer can be arranged to contact the dielectric layer such that the capping dielectric layer isolates the conductive rhodium-based nanoparticles from other conductive elements for the electronic device. The conductive rhodium-based nanoparticles can be formed separate from forming the dielectric layer and from forming the capping dielectric layer. In the electronic device, the conductive rhodium-based nanoparticles can be structured as charge traps. These charge traps can be used as charge storage elements.

The conductive rhodium-based nanoparticles can take various forms. The conductive rhodium-based nanoparticles can be nanoparticles consisting of rhodium. The conductive rhodium-based nanoparticles can be conductive rhodium oxide nanoparticles. The conductive rhodium-based nanoparticles can be rhodium nanoparticles covered with a conductive rhodium oxide.

In various embodiments, a rhodium-containing precursor can be introduced into the reaction chamber containing a substrate on which a dielectric layer for an integrated circuit has been formed, after subjecting the dielectric layer to a plasma using a non-reactive gas. The non-reactive gas can include an argon plasma or other inert gas in plasma form. The flow of the rhodium-containing precursor can be conducted while turning off the flow of the non-reactive gas in the reaction chamber. The rhodium precursor can then sustain the plasma along with a helium carrier gas used with the rhodium precursor. Maintaining the flow of the rhodium-containing precursor into the reaction chamber can be performed such that conductive rhodium nanoparticles are formed on the formed dielectric layer with each of the conductive rhodium nanoparticles isolated from the other conductive rhodium nanoparticles. In various embodiments, the flow of the rhodium-containing precursor into the reaction chamber can be turned off after 2 seconds of flow. Alternatively, the flow of the rhodium-containing precursor into the reaction chamber can be turned off after 10 seconds of flow or less than 10 seconds. The period of deposition time can be set at 5 seconds or less.

The rhodium nanoparticles can be processed to form nanoparticles essentially consisting of rhodium, to form conductive rhodium oxide nanoparticles, to form rhodium nanoparticles covered with a conductive rhodium oxide, or to form combinations of these nanoparticles embedded in a dielectric material. Conductive rhodium oxide nanoparticles can be formed by oxidizing formed rhodium nanoparticles. In various embodiments, oxygen can be supplied during the deposition of the rhodium. Rhodium nanoparticles covered with a conductive rhodium oxide can be formed by exposing the rhodium nanoparticles to oxygen to form a native oxide covering rhodium elements forming the nanoparticles. Rhodium nanoparticles covered with a conductive rhodium oxide can be disposed on the dielectric layer such that each rhodium nanoparticle covered with a conductive rhodium oxide are isolated from other rhodium nanoparticles covered with a conductive rhodium oxide.

The conductive rhodium-based nanoparticles can be structured with various spacings between the conductive rhodium-based nanoparticles. The spacing can be selected, but is not limited to, to be about an effective diameter of a conductive rhodium-based nanoparticle. Deposition times of rhodium can be controlled such that the formed conductive rhodium-based nanoparticles have a density based on the controlled deposition times. The temperatures of the reaction chamber and the substrate can be controlled during deposition such that the formed conductive rhodium nanoparticles have a size based on the controlled temperatures of the reaction chamber and the substrate. In addition, a deposition technique can be selected as a parameter to provide conductive rhodium-based nanoparticles with a set of electrical and physical parameters.

Formed rhodium-based nanoparticles can be further processed such that a capping dielectric layer is formed on and contacting the formed conductive rhodium-based nanoparticles. The capping dielectric layer can be arranged to contact the dielectric layer such that the capping dielectric layer isolates the conductive rhodium-based nanoparticles from other conductive elements in the electronic device in which the rhodium-based nanoparticles are disposed. The capping dielectric layer and/or the dielectric layer can include a high-κ dielectric layer. A set of high-κ dielectric may include, but is not limited to, $HfO_x$, $ZrO_x$, $TiO_x$, $TaO_x$, $AlO_x$, $LaAlO_x$, the lanthanide oxides, other metal oxides, and corresponding metal silicates. Other dielectric materials can be used. For example, silicon oxide and/or silicon nitride can be structured in the capping dielectric layer and/or the dielectric layer with a high-κ dielectric layer. An electronic device containing these conductive rhodium-based nanoparticles can be configured such that the conductive rhodium-based nanoparticles operate with the dielectric material as charge traps to store charge.

Conductive rhodium-based nanoparticles can be constructed as isolated nanoparticles to form a charge storage unit that can be structured in each memory cell of an array of memory cells forming a memory. These conductive rhodium-based nanoparticles can be formed to be in contact with a high-κ dielectric layer that isolates these nanoparticles from other conductive elements. Conductive rhodium-based nanoparticles can be constructed as isolated nanoparticles in a controller and/or an electronic apparatus coupled to the controller.

Figure 2A:
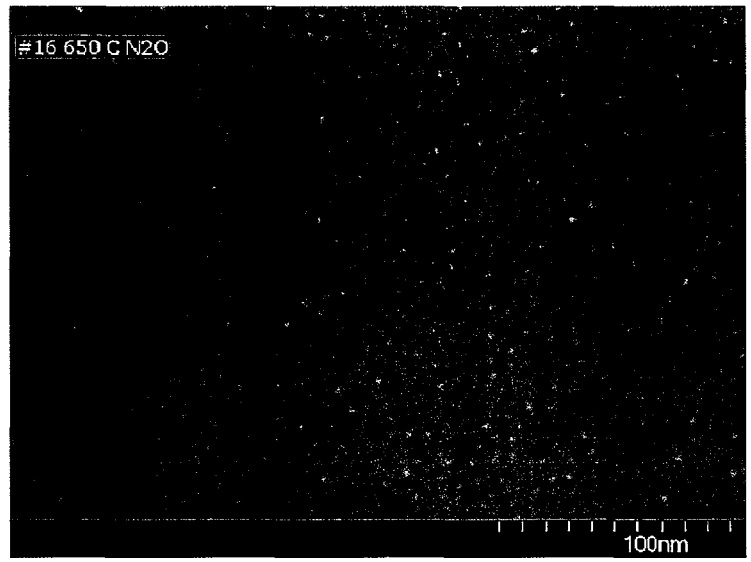
FIGS. 2A and 2B illustrate scanning electron microscope (SEM) images of an embodiment of platinum nanoparticles at 650° C. and 750° C.
Figure 2B:
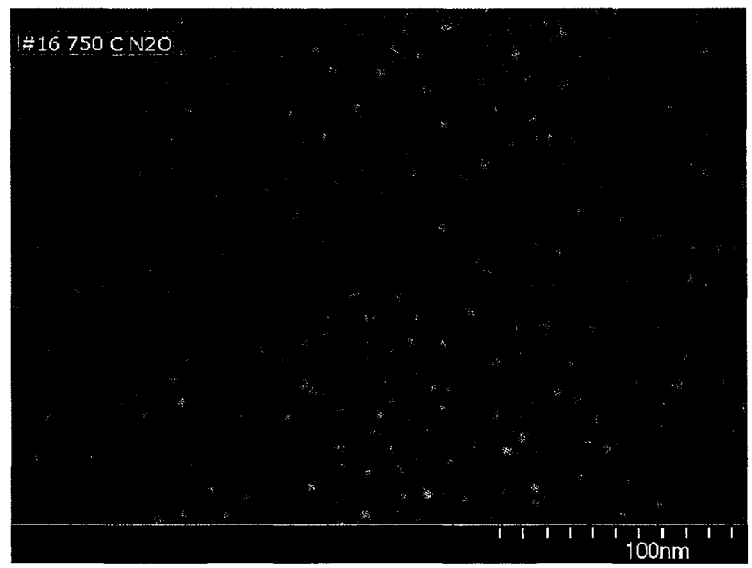
Figure 3A:
FIGS. 3A and 3B illustrate SEM images of an embodiment of platinum nanoparticles at 850° C. and 950° C.
Figure 3B:

In various embodiments, the size of conductive nanoparticles may be increased by annealing. In an embodiment, platinum nanoparticles remain stable in an $N_2O$ atmosphere up to 650° C., but may begin to form an agglomeration at 750° C. FIGS. 2A, 2B illustrate SEM images of platinum nanoparticles at 650° C. and 750° C. In a $NH_3$ atmosphere, platinum nanoparticles may be stable up to 850° C., but may begin incremental agglomeration at 25° C. intervals above 850° C., with large crystals and spacing occurring at 950° C. FIGS. 3A, 3B illustrate SEM images of platinum nanoparticles at 850° C. and 950° C. By selectively controlling annealing, different formats for isolated conductive material may be formed allowing the selection of dense, discrete conductive nanoparticles or enlarged islands of conductive nanoparticles with larger spacing, depending on the application. The spacing between isolated conductive nanoparticle islands may be correlated to the effective diameter of these isolated conductive nanoparticle islands.

The selection of a conductive nanoparticle can depend on the retention state charge loss for the conductive nanoparticles used as charge traps in a charge trap layer, which forms part of a charge storage unit. For example, from a 7V initial P/E window for Pt nanoparticles formed by an 8 second PECVD process, a retention state charge loss of 1.958 volts at 150° C. at 24 hrs can occur, while for Rh nanoparticles formed by a 5 second PECVD process, a retention state charge loss of 0.953 volts can be attained, which is a significant decrease in charge loss compared with the Pt nanoparticles. Further reduction in retention state charge loss to 0.454 volts can be attained for Rh nanoparticles formed by a 2 second PECVD process. In various embodiments, Rh-based nanoparticles are constructed with a retention state property of 1 volt or less at 150° C. at 24 hrs.

Figure 4B:
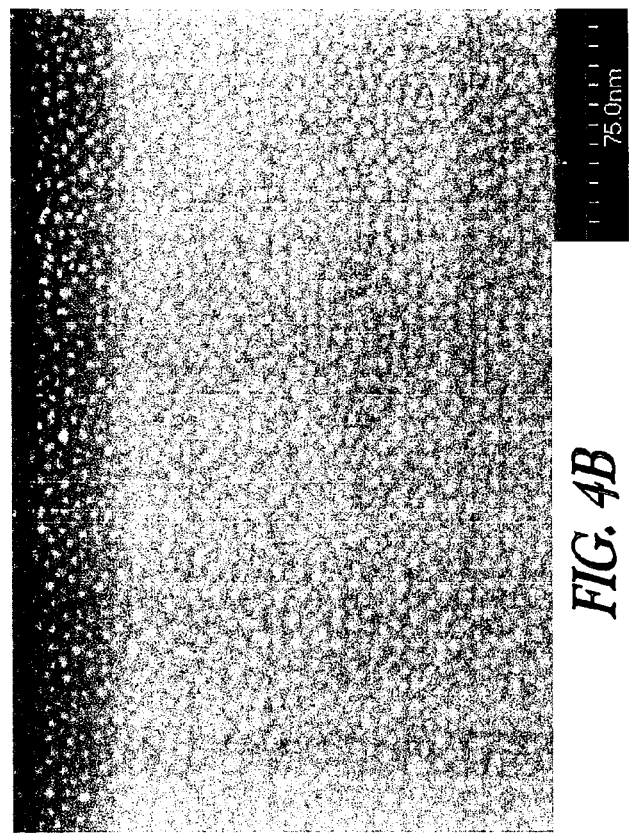
FIGS. 4A and 4B show SEM images of rhodium nanoparticles formed in a center region of deposition and formed at an edge of the deposition region, respectively, for a 10 second deposition.
Figure 4A:
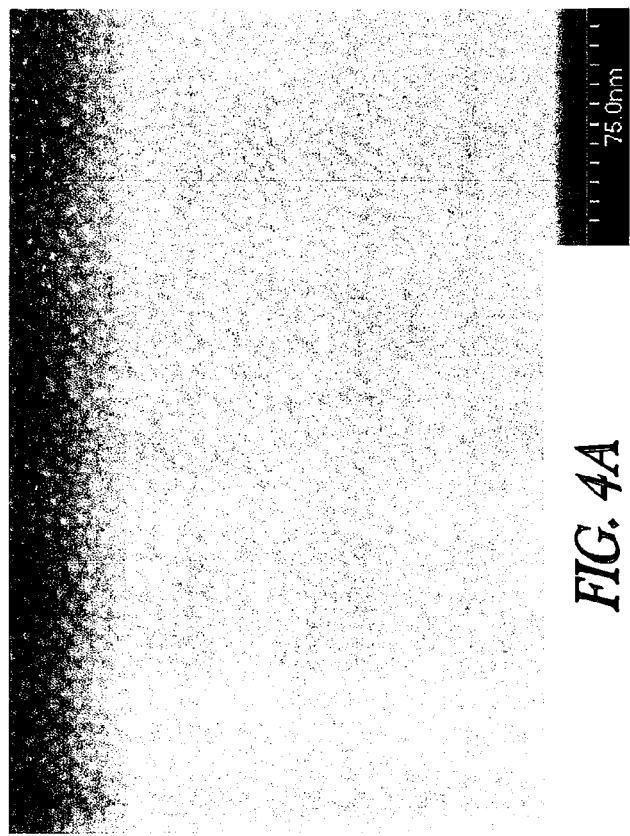

Various properties of nanoparticles formed on dielectric material may vary with deposition time. For example, the size and density of nanoparticles can vary with deposition time. FIGS. 4A and 4B show SEM images of rhodium nanoparticles formed in a center region of deposition and formed at an edge of the deposition region, respectively, for a 10 second deposition. At the center region, the density of the Rh nanoparticles was determined to be in the range of $2.0 \times 10^{12}$ $cm^{-2}$ to $2.8 \times 10^{12}$ $cm^{-2}$ with effective diameters determined to be in the range of 4.36 nm to 4.75 nm. At the edge, the density of the Rh nanoparticles was determined to be in the range of $2.6 \times 10^{12}$ $cm^{-2}$ to $3.2 \times 10^{12}$ $cm^{-2}$ with effective diameters determined to be in the range of 3.8 nm to 3.94 nm.

FIGS. 5A and 5B show SEM images of rhodium nanoparticles formed in a center region of deposition and formed at an edge of the deposition region, respectively, for a 5 second deposition. At the center region, the density of the Rh nanoparticles was determined to be in the range of $2.7 \times 10^{12}$ $cm^{-2}$ to $3.4 \times 10^{12}$ $cm^{-2}$ with effective diameters determined to be in the range of 3.58 nm to 3.84 nm. At the edge, the density of the Rh nanoparticles was determined to be in the range of $2.8 \times 10^{12}$ $cm^{-2}$ to $3.5 \times 10^{12}$ $cm^{-2}$ with effective diameters determined to be in the range of 2.93 nm to 3.86 nm.

FIGS. 6A and 6B show SEM images of rhodium nanoparticles formed in a center region of deposition and formed at an edge of the deposition region, respectively, for a 2 second deposition. At the center region, the density of the Rh nanoparticles was determined to be in the range of $1.6 \times 10^{12}$ $cm^{-2}$ to $2.8 \times 10^{12}$ $cm^{-2}$ with effective diameters determined to be in the range of 4.71 nm to 5.34 nm. At the edge, the density of the Rh nanoparticles was determined to be in the range of $1.9 \times 10^{12}$ $cm^{-2}$ to $2.5 \times 10^{12}$ $cm^{-2}$ with effective diameters determined to be in the range of 4.06 nm to 4.47 nm.

Figure 7:
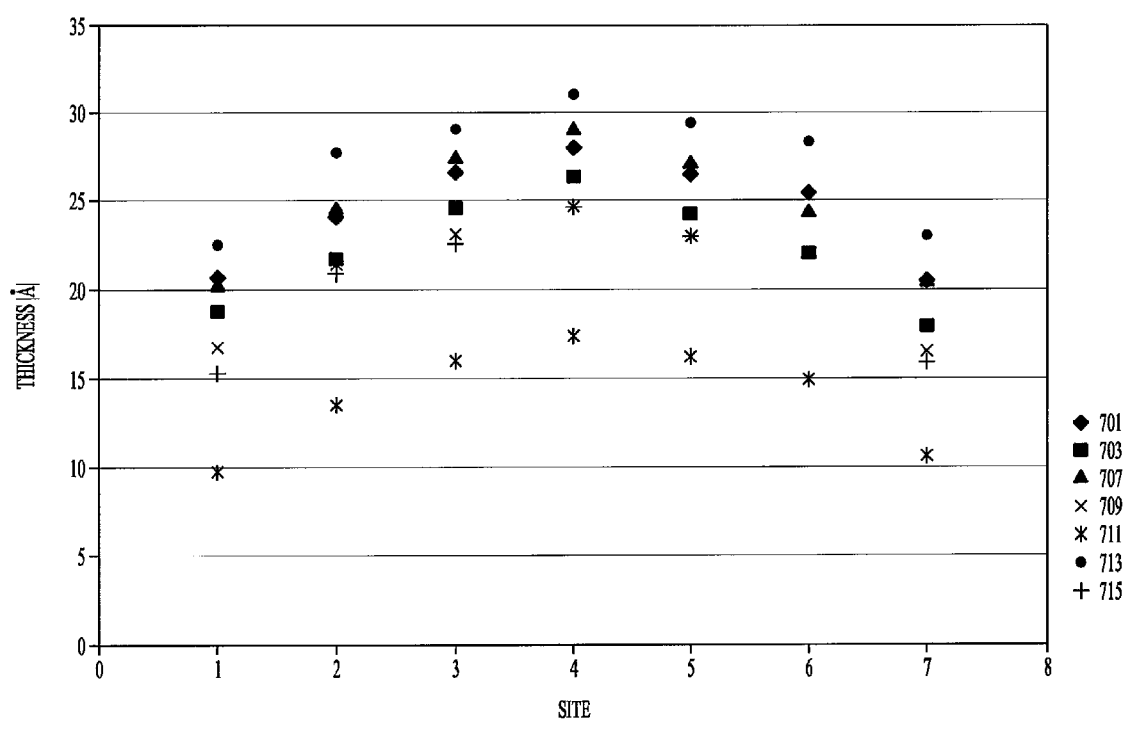
FIG. 7 shows a variation of thickness of an effective layer of nanoparticles at various sites across a wafer for different nanoparticles.

FIG. 7 shows a variation of thickness of an effective layer of nanoparticles at various sites across a wafer for different nanoparticles. The sites are selected on each of the wafers, corresponding to different nanoparticles, to be relatively the same for each example formation of nanoparticles. Data points 701 shows the effective thickness in angstroms for Pt nanoparticles formed in an 8 second deposition. Data points 703 shows the effective thickness for Pt nanoparticles formed in a second 8 second deposition formation. Data points 707 shows the effective thickness for Pt nanoparticles formed in a 12 second deposition. Data points 709 shows the effective thickness for Rh nanoparticles formed in a 5 second deposition. Data points 711 shows the effective thickness for Rh nanoparticles formed in a 2 second deposition. Data points 713 shows the effective thickness for Rh nanoparticles formed in a 10 second deposition. Data points 717 shows the effective thickness for Rh nanoparticles formed in a second 5 second deposition.

In various embodiments, conductive nanoparticles can be formed as charge traps with high-κ dielectrics, such as $HfO_x$. Even though platinum has a higher vacuum work function than rhodium, the effective work function of rhodium at a rhodium-hafnium oxide interface is higher than platinum at a platinum-hafnium oxide interface. The effective work function for $Pt/HfO_2$ is in the range for 4.6-4.9 eV, while the effective work function for $Rh/HfO_2$ has been reported to be about 5.25 eV. See, for example, Park, K. J. and Parsons, G. N., "Selective area atomic layer deposition of rhodium and effective work function characterization in capacitor structures," Applied Physics Letters, 89, 043111-1-043111-3, (2006). The reduced effective work function of platinum may be due to Fermi pinning. In addition, rhodium can provide less surface diffusion and agglomeration that platinum when heated. Rhodium-based nanoparticles can be formed contacting $HfO_x$ in a dielectric stack such as a dielectric structure including $HfO_x/AlO_x/HfO_x$. Other dielectric stacks containing $HfO_x$ can be used with rhodium-based nanoparticles. Furthermore, other dielectric materials and/or dielectric stack structures can be used to interface to rhodium-based nanoparticles.

Figure 8:
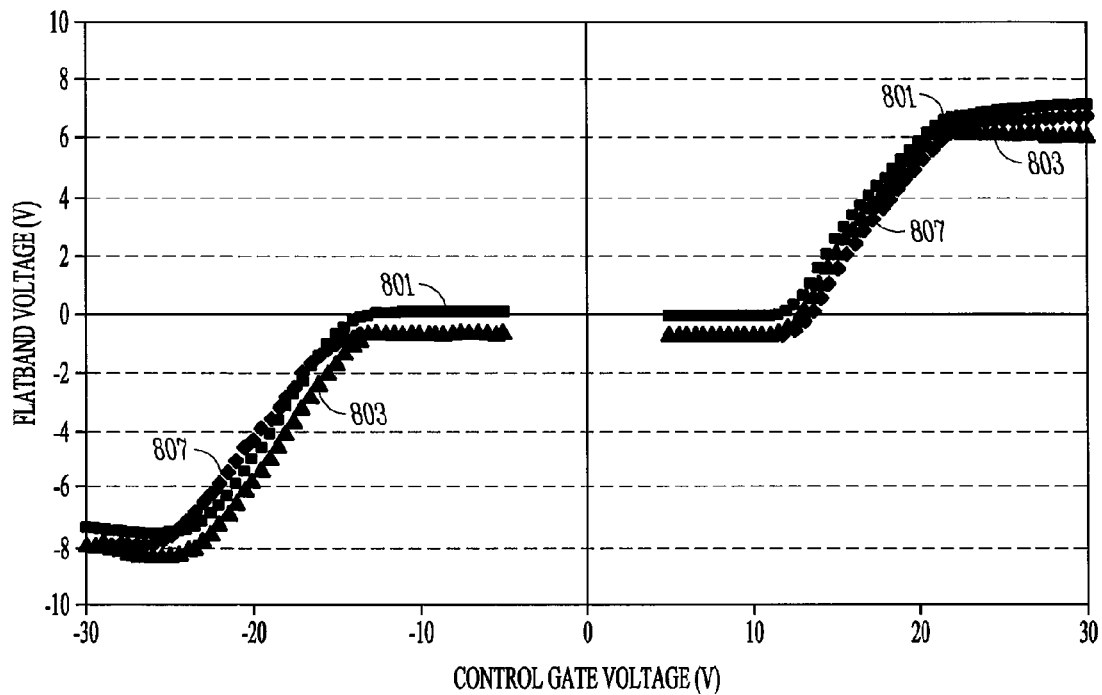
FIG. 8 shows example electrical characteristics of flat capacitor structures having different conductive nanoparticles embedded in a substantially dielectric stack.

FIG. 8 shows example electrical characteristics of flat capacitor structures having different conductive nanoparticles embedded in a substantially dielectric stack. The example dielectric stack is arranged as 80 Å $SiO_2$/nanoparticles/150 Å $Al_2O_3$/44 Å $HfO_2$ with a TaN layer formed on the $HfO_2$ layer. Curve 801 shows the flatband voltage as a function of control gate voltage of a flat capacitor, where the nanoparticles are Pt nanoparticles formed by PECVD with an 8 second deposition time. This flatband voltage characteristic includes a slope of 0.886. Curve 803 shows the flatband voltage as a function of control gate voltage of a flat capacitor, where the nanoparticles are Rh nanoparticles formed by PECVD with a 5 second deposition time. This flatband voltage characteristic includes a slope of 0.863. Curve 807 shows the flatband voltage as a function of control gate voltage of a flat capacitor, where the nanoparticles are Rh nanoparticles formed by PECVD with a 2 second deposition time. This flatband voltage characteristic includes a slope of 0.856. These structures indicate use of Pt and/or Rh with a P/E window greater than 12 volts with slopes ranging from 0.85 to 0.88.

Figure 9:
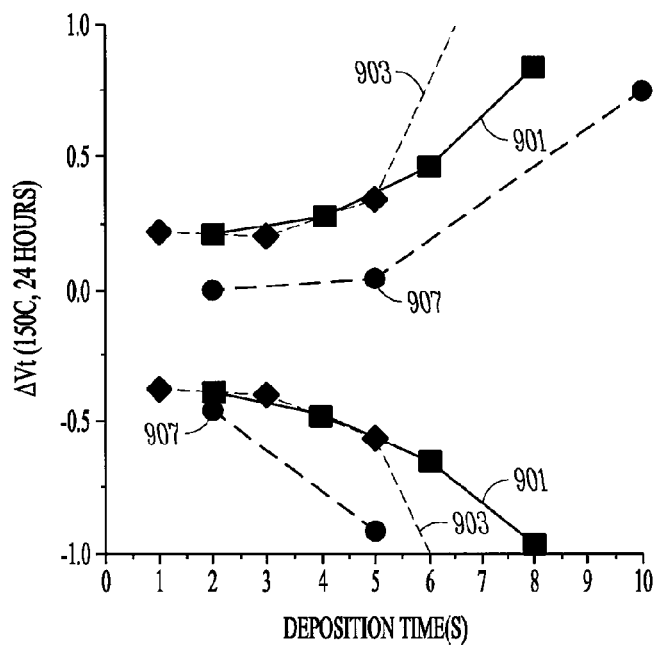
FIG. 9 shows the variation of a change in threshold voltage as a function of deposition time for structures having different conductive nanoparticles embedded in a substantially dielectric stack.

FIG. 9 shows the variation of a change in threshold voltage as a function of deposition time for structures having different conductive nanoparticles embedded in a substantially dielectric stack. The dielectric stack is arranged as in FIG. 8 and the variation, $\Delta V_t$, of the threshold voltage, $V_t$, is for a 24 hour period at 150° C. The variation, $\Delta V_t$, is indicative of retention state charge loss. Curve 901 shows $\Delta V_t$ for the structure, where the nanoparticles are Pt nanoparticles formed by CVD. Curve 903 shows $\Delta V_t$ for the structure, where the nanoparticles are Pt nanoparticles formed by PVD. Curve 907 shows $\Delta V_t$ for the structure, where the nanoparticles are Rh nanoparticles formed by CVD. FIG. 9 shows that Rh nanoparticles in a dielectric stack perform significantly better than Pt nanoparticles with respect to retention state charge loss at 150° C., 24 hrs.

In various embodiments, the size and density of nanoparticles depends on the deposition technique and the type of conductive nanoparticle being formed. For an application using particular conductive nanoparticle at specific size and density, the size and density control for the desired material can be regulated by the deposition method. In addition to different types of deposition process such as ALD, PECVD, and or other techniques, the various parameters that differentiate methods, hence nanoparticle properties, include the number of ALD cycles, deposition times, post-deposition annealing, and other independently controlled process factors. Table 1 illustrates an example of differences in the density and size of nanoparticles using different deposition techniques and the type of conductive nanoparticle being formed. As shown in Table 1, longer PECVD deposition times or greater number of ALD cycles increase the diameter of the nanoparticles. In addition, deposition techniques can have significant effect on nanoparticle density as shown in the Table 1.

TABLE 1

| Nanoparticle Type | Density | Diameter, nm |
|---|---|---|
| Co ALD | $4.0 \times 10^{12}/cm^2$ | 3.6 |
| Ru PECVD | $5.5 \times 10^{12}/cm^2$ | 3.5 |
| 1 cycle Pt ALD | $2.1 \times 10^{12}/cm^2$ | 3.7 |
| 2 cycle Pt ALD | $1.8 \times 10^{12}/cm^2$ | 4.8 |
| 8s Pt PECVD | $3.2 \times 10^{12}/cm^2$ | 4.6 |
| 2s Rh PECVD | $3.2 \times 10^{12}/cm^2$ | 3.6 |
| 5s Rh PECVD | $3.4 \times 10^{12}/cm^2$ | 3.8 |

In various embodiments, nanoparticle diameters and densities can be varied by deposition type and process parameters. Nanoparticle diameters and densities can range from 3.3-4.8 nm and $1.8 \times 10^{12}/cm^2$-$5.5 \times 10^{12}/cm^2$, respectively. Other nanoparticle diameters and densities can be attained. Electrical properties can vary depending on the conductive nanoparticle formed. In various embodiments, Rh and Pt nanoparticles provided enhanced electrical properties with respect to other conductive nanoparticles such as nanoparticles of Co and Ru. In various embodiments, P/E voltage responses of Rh and Pt nanoparticles are substantially equivalent with Rh providing superior retention characteristics relative to Pt nanoparticles.

Figure 10A:
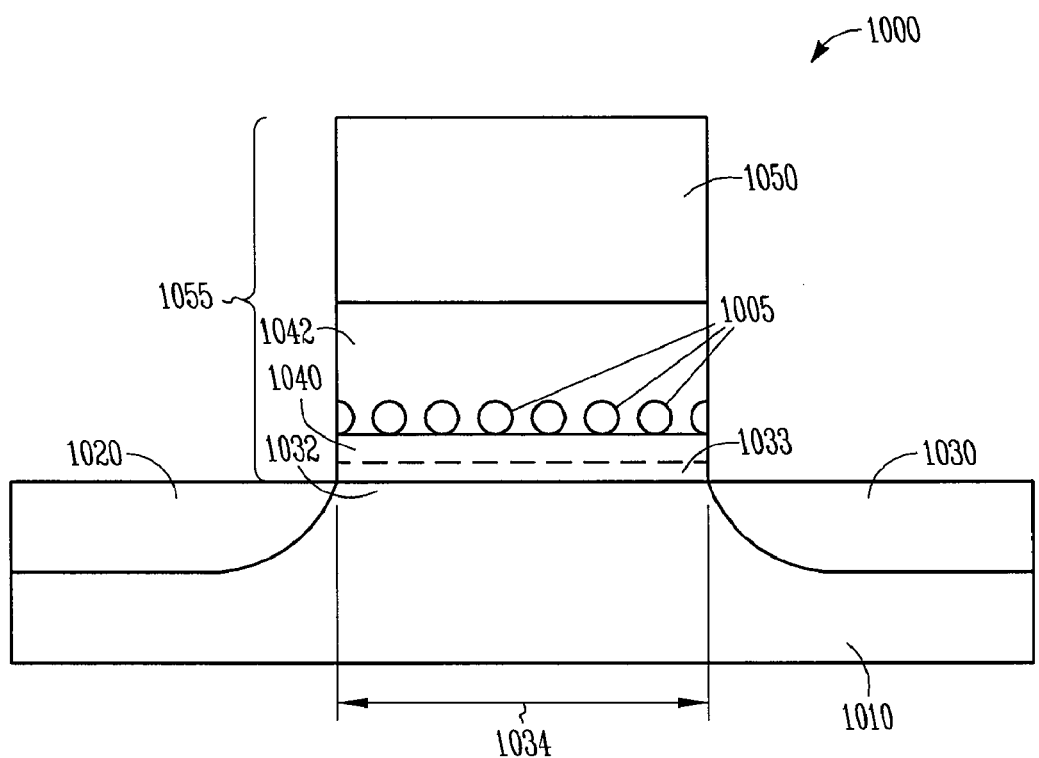
FIG. 10A depicts an embodiment of a configuration of a floating gate transistor having isolated conductive nanoparticles as its floating gate.

FIG. 10A shows an embodiment of a configuration of a floating gate transistor 1000 having isolated conductive nanoparticles 1005 as its floating gate. Transistor 1000 includes a silicon based substrate 1010 with a source 1020 and a drain 1030 separated by a body region 1032. However, transistor 1000 is not limited to silicon based substrates, but may be used with a variety of semiconductor and insulating substrates. Body region 1032 between source 1020 and drain 1030 defines a channel region having a channel length 1034. Located above body region 1032 is a stack 1055 including a gate dielectric 1040, conductive nanoparticles 1005 as a floating gate, a floating gate dielectric 1042, and a control gate 1050. An interfacial layer 1033 may form between body region 1032 and gate dielectric 1040. In an embodiment, interfacial layer 1033 may be limited to a relatively small thickness compared to gate dielectric 1040, or to a thickness significantly less than the thickness of gate dielectric 1040 such that the interfacial layer 1033 is effectively eliminated.

Conductive nanoparticles 1005 may be structured as a layer of spaced-apart conductive particles. Alternatively, the conductive nanoparticles may be structured as a number of layers of spaced-apart conductive particles. In an embodiment, the number of layers, or thickness of the film of isolated conductive nanoparticles, is selected to provide charge trapping to the various levels of conductive nanoparticles by a tunneling mechanism. Such a thickness or distance from body region 1032 is dependent on the application. Conductive nanoparticles 1005 may include, but are not limited to, platinum nanoparticles, ruthenium nanoparticles, conductive ruthenium oxide nanoparticles, rhodium-based nanoparticles, nanoparticles of other transition metals (W, Ni, etc.), noble metals (Ir, Pd, etc.), conductive metal oxides, conductive nitrides, and other conductive compounds.

Gate dielectric 1040 may be configured as a tunneling dielectric. In an embodiment, gate dielectric 1040 has a thickness, measured as the shortest distance from body region 1032 to a conductive nanoparticle, of 30 Å or less. In an embodiment, floating dielectric 1042 has a thickness, measured as the shortest distance from control gate 1050 to a conductive nanoparticle, between about 100 Å and about 150 Å. Gate dielectric 1040 and floating gate 1042 may be composed of the same component materials or different component materials. The insulating materials selected for gate dielectric 1040 and floating gate dielectric 1042 may be selected to reduce or eliminate oxidation of the conductive nanoparticles during processing subsequent to their formation. The material for gate dielectric 1040 and floating gate dielectric 1042 may include, but is not limited to, silicon oxide, insulating nitrides, insulating oxynitrides, and high-κ dielectric materials. Gate dielectric 1040 and floating gate dielectric 1042 may each be structured as a single dielectric layer or as a stack of dielectric layers.

Various embodiments for charge storage units using isolated conductive nanoparticles on a dielectric layer may provide for enhanced device performance by providing devices with reduced leakage current. In a floating gate transistor, a number of conductive nanoparticles replace a conventional floating gate that may be considered to be structured as a plate. Leakage for a conventional floating gate or for an embodiment of conductive nanoparticles may typically be determined by defects, which are not uniform in the structure. If the leakage is mainly by defects, then using isolated conductive nanoparticles, only a few of the nanoparticles are associated with the defects from which charge may leak. With a few associated leakage sites, such leakage may be ignored since it is associated with charge trapped in a few nanoparticles. However, with a conventional plate configuration, the entire plate is conductively coupled associating non-uniform defects with the entire plate such that charge may be conducted to the defects, increasing the amount of leakage charge. With a much lower leakage associated with the conductive nanoparticles as compared with the conventional floating gate, thinner gate dielectric 1040 may be used with the conductive nanoparticles. Further, structures with thinner gate dielectric 1040 also allow the use of lower voltages to program charge in floating transistor 1000.

Figure 10B:
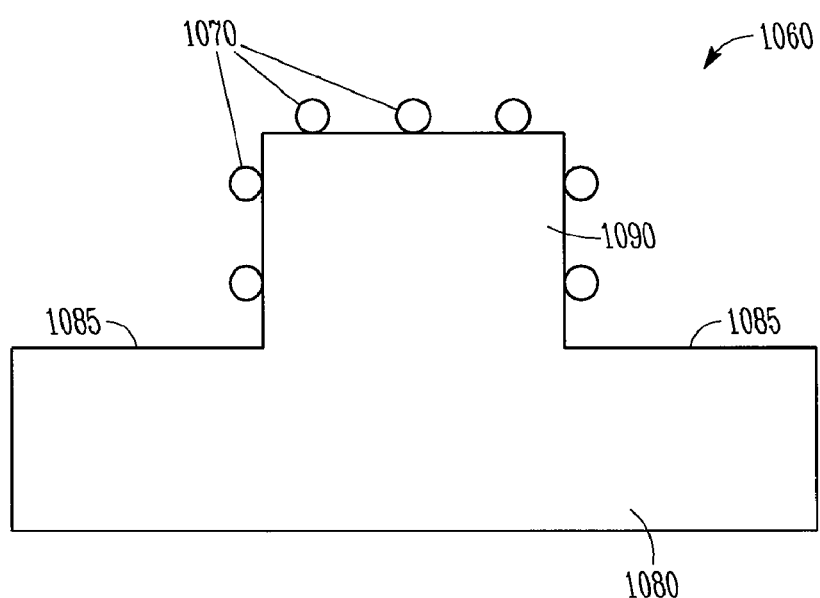
FIG. 10B depicts an embodiment of a three-dimensional structure of isolated conductive nanoparticles.

In an embodiment, conductive nanoparticles may be configured with a structure having three-dimensional features rather than a flat structure. A flat structure may be considered to be a planar structure whose three-dimensional aspect is provided by having a uniform or gradual-varying thickness. FIG. 10B shows an embodiment of a structure 1060 having spaced-apart conductive nanoparticles 1070 with three-dimensional features. Conductive nanoparticles 1070 may be formed on a dielectric layer 1080 having stud 1090 protruding up from a surface 1085 of dielectric layer 1080. Conductive nanoparticles 1070 may be disposed around vertical and horizontal sides of stud 1090. Stud 1090 is not limited to having perpendicular walls, but may be have various shapes protruding from surface 1085 of dielectric layer 1080. Various embodiments provide conductive nanoparticles as a charge storage unit configured in multiple planes or in a non-planar arrangement. Structure 1060 may be used in the floating gate transistor 1000 of FIG. 10A.

Additional improvements in leakage current characteristics may be attained by forming one or more of gate dielectric 1040 and floating gate dielectric 1042 in a nanolaminate structure. The transition from one layer of the nanolaminate to another layer of the nanolaminate provides further disruption to a tendency for an ordered structure in the nanolaminate stack, eliminating the occurrence of convenient paths from body region 1032 to conductive nanoparticles 1005.

Transistors and other devices having isolated conductive nanoparticles on a dielectric layer can be implemented into memory devices and electronic systems including information handling devices. Embodiments of these information handling devices may include telecommunication systems, wireless systems, and computers.

Figure 11:
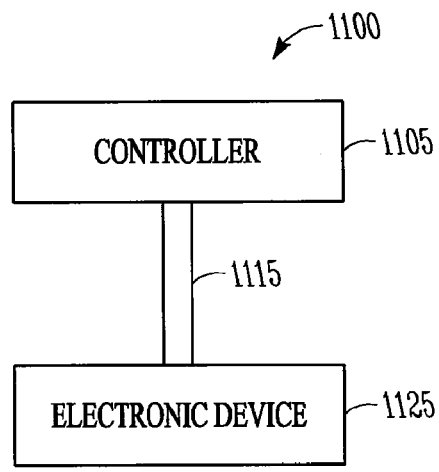
FIG. 11 is a simplified block diagram for an embodiment of an electronic system having a controller coupled to an electronic device, where the controller and/or the electronic device have a charge storage unit configured as isolated conductive nanoparticles on a dielectric layer.

FIG. 11 is a simplified block diagram for an embodiment of an electronic system 1100 having a controller 1105 coupled to an electronic device 1125, where controller 1105 and/or electronic device 1125 have a charge storage unit configured as isolated conductive nanoparticles on a dielectric layer, in accordance with various embodiments. Electronic system 1100 includes a bus 1115, where bus 1115 provides electrical conductivity between controller 1105 and electronic device 1125. Electronic system 1100 may include, but is not limited to, information handling devices, wireless systems, telecommunication systems, fiber optic systems, electro-optic systems, and computers.

Figure 12:
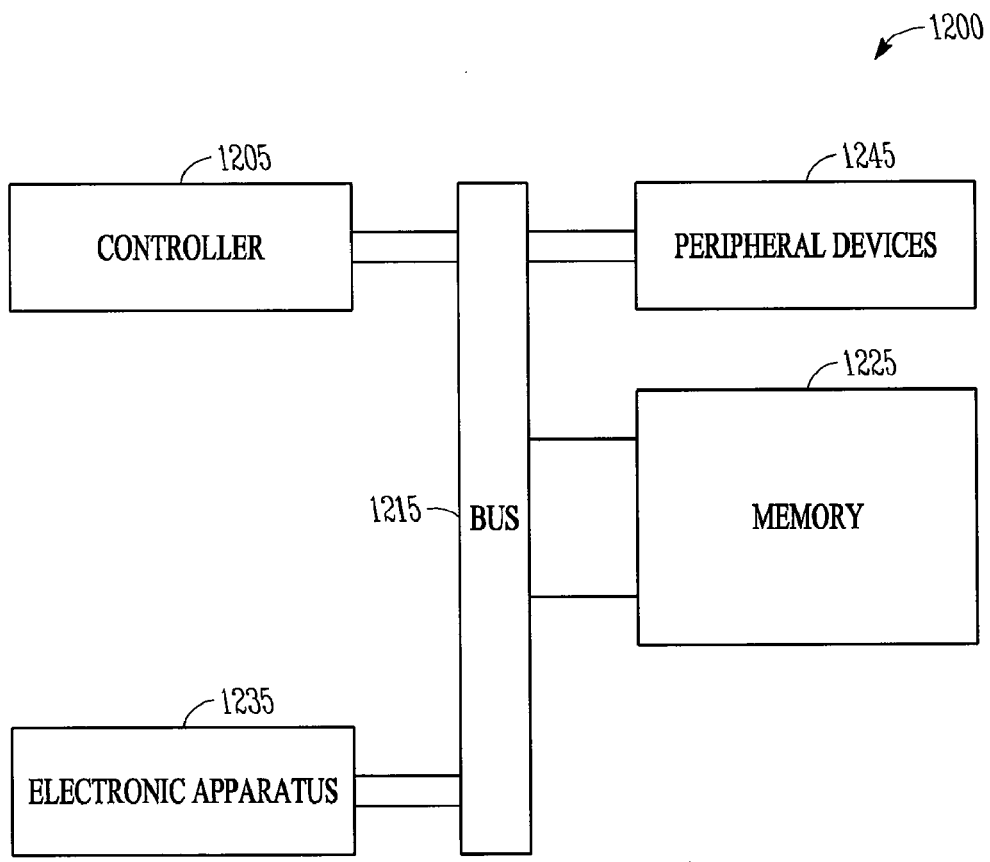
FIG. 12 illustrates a block diagram for an embodiment of an electronic system having a charge storage unit configured as isolated conductive nanoparticles on a dielectric layer.

FIG. 12 illustrates a block diagram for an embodiment of an electronic system 1200 having a charge storage unit configured as isolated conductive nanoparticles on a dielectric layer. System 1200 may include a controller 1205, a memory 1225, an electronic apparatus 1235, and a bus 1215, where bus 1215 provides electrical conductivity between controller 1205 and electronic apparatus 1235, and between controller 1205 and memory 1225. Bus 1215 may include an address bus, a data bus, and a control bus, each independently configured. Alternatively, bus 1215 may use common conductive lines for providing address, data, and/or control, the use of which is regulated by controller 1205. In an embodiment, electronic apparatus 1235 may be additional memory configured similar as memory 1225. An embodiment may include an additional peripheral device or devices 1245 coupled to bus 1215. In an embodiment, controller 1205 is a processor. In an embodiment, controller 1205 is a processor having a memory. Any of controller 1205, memory 1225, bus 1215, electronic apparatus 1235, and peripheral device devices 1245 may include an embodiment of a charge storage unit configured as isolated conductive nanoparticles on a dielectric layer. System 1200 may include, but is not limited to, information handling devices, telecommunication systems, and computers.

Peripheral devices 1245 may include displays, additional storage memory, or other control devices that may operate in conjunction with controller 1205. Alternatively, peripheral devices 1245 may include displays, additional storage memory, or other control devices that may operate in conjunction with controller 1205 and/or memory 1225.

Memory 1225 may be realized as a memory device having a charge storage unit configured as isolated conductive nanoparticles on a dielectric layer, in accordance with various embodiments. It will be understood that embodiments are equally applicable to any size and type of memory circuit and are not intended to be limited to a particular type of memory device. In an embodiment, a flash memory may include an array of memory cells, each memory cell having a charge storage unit configured as isolated conductive nanoparticles on a dielectric layer. The conductive nanoparticles of a charge storage unit serve as a charge trapping layer instead of a structure having a polysilicon floating gate, as discussed with respect to embodiments associated with FIGS. 10A-10B. Each charge storage unit may be accessed using word lines, where the conductive nanoparticles provide for reduction of word line coupling. In addition, the conductive nanoparticles enable the use of reduced programming voltages and provide enhanced charge leakage characteristics. Such properties may provide for increased density of memory cells.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method of forming an electronic device, the method comprising:
   forming a dielectric on a substrate;
   after forming the dielectric, forming conductive rhodium-based nanoparticles on the formed dielectric including forming the rhodium in the conductive rhodium-based nanoparticles with a deposition time selected to attain a predetermined retention loss property, the conductive rhodium-based nanoparticles formed by a plasma-assisted deposition process such that each conductive rhodium-based nanoparticle is isolated from the other conductive rhodium-based nanoparticles; and
   after forming the conductive rhodium-based nanoparticles, forming a capping dielectric on and contacting the formed conductive rhodium-based nanoparticles, the capping dielectric contacting the dielectric such that the capping dielectric isolates the conductive rhodium-based nanoparticles from conductive elements, wherein the conductive rhodium-based nanoparticles are configured as charge traps.

2. The method of claim 1, wherein forming the rhodium in the conductive rhodium-based nanoparticles with a deposition time selected to attain a predetermined retention loss property includes forming the rhodium in the conductive rhodium-based nanoparticles with a deposition time selected corresponding to a retention loss property of 1 volt or less at 150° C. at 24 hrs.

3. The method of claim 1, wherein forming conductive rhodium-based nanoparticles comprises forming conductive rhodium oxide nanoparticles.

4. The method of claim 1, wherein forming conductive rhodium-based nanoparticles comprises forming a conductive rhodium nanoparticle covered with a conductive rhodium oxide.

5. The method of claim 4, wherein forming conductive rhodium-based nanoparticles comprises using a $(C_5H_5)Rh(CO)_2$ precursor.

6. The method of claim 1, wherein forming a capping dielectric comprises forming the capping dielectric with the same material composition as the dielectric.

7. The method of claim 1, wherein forming the dielectric, the conductive rhodium-based nanoparticles on the formed dielectric, the capping dielectric on and contacting the formed conductive rhodium-based nanoparticles includes forming the dielectric, the conductive rhodium-based nanoparticles, and the capping dielectric in a nanolaminate structure.

8. The method of claim 1, wherein the method includes forming the conductive rhodium-based nanoparticles such that a plurality of the conductive rhodium-based nanoparticles are disposed on a first plane and another plurality of the conductive rhodium-based nanoparticles are disposed on a second plane, the second plane intersecting the first plane.

9. The method of claim 1, wherein the method includes annealing the conductive rhodium-based nanoparticles at conditions such that the conductive rhodium-based nanoparticles are increased in size forming isolated agglomerations of particles as isolated enlarged islands of conductive rhodium-based nanoparticles.

10. The method of claim 9, wherein annealing the conductive rhodium-based nanoparticles includes annealing the conductive rhodium-based nanoparticles such that the conductive rhodium-based nanoparticles are increased by a factor of about five.

11. A method of forming an electronic device, the method comprising:
    forming a dielectric in an integrated circuit on a substrate in a reaction chamber;
    after forming the dielectric, subjecting the dielectric to a plasma using a non-reactive gas;
    introducing a rhodium-containing precursor into the reaction chamber while turning off the flow of the non-reactive gas in the reaction chamber and maintaining flow of the rhodium-containing precursor into the reaction chamber such that conductive rhodium nanoparticles are formed on the formed dielectric with each of the conductive rhodium nanoparticles isolated from the other conductive rhodium nanoparticles; and
    after forming the conductive rhodium nanoparticles, forming a capping dielectric on and contacting the formed conductive rhodium nanoparticles and contacting the dielectric such that the capping dielectric isolates the conductive rhodium nanoparticles from conductive elements, wherein forming the conductive rhodium nanoparticles is preformed separate from forming the dielectric and from forming the capping dielectric, wherein the conductive rhodium-based nanoparticles are configured as charge traps.

12. The method of claim 11, wherein subjecting the dielectric to a plasma using a non-reactive gas includes using an argon plasma.

13. The method of claim 11, wherein maintaining flow of the rhodium-containing precursor into the reaction chamber includes turning the flow of the rhodium-containing precursor into the reaction chamber off after 2 seconds of flow.

14. The method of claim 11, wherein maintaining flow of the rhodium-containing precursor into the reaction chamber includes limiting the flow of the rhodium-containing precursor into the reaction chamber to 10 seconds of flow or less than 10 seconds of flow.

15. The method of claim 11, wherein the method comprises controlling temperatures of the reaction chamber and the substrate such that the formed conductive rhodium nanoparticles have a size based on the controlled temperatures of the reaction chamber and the substrate.

16. The method of claim 11, wherein forming conductive rhodium nanoparticles includes forming the conductive rhodium nanoparticles such that spacing between the conductive rhodium nanoparticles is at about an effective diameter of a conductive rhodium nanoparticle.

17. The method of claim 11, wherein the method includes annealing the conductive rhodium nanoparticles at conditions such that the conductive rhodium nanoparticles are increased in size forming isolated agglomerations of particles as isolated enlarged islands of conductive rhodium nanoparticles.

18. A method of forming a memory, the method comprising:
    forming an array of memory cells on a substrate in a reaction chamber, each memory cell having a charge storage unit structured by:

forming a high-κ dielectric on the substrate;

after forming the high-κ dielectric, forming conductive rhodium-based nanoparticles on the formed high-κ dielectric including forming the rhodium in the conductive rhodium-based nanoparticles with a deposition time selected to attain a predetermined retention loss property, the conductive rhodium-based nanoparticles formed by a plasma-assisted deposition process such that each conductive rhodium-based nanoparticle is isolated from the other conductive rhodium-based nanoparticles; and after forming the conductive rhodium-based nanoparticles, forming a capping dielectric on and contacting the formed conductive rhodium-based nanoparticles and contacting the high-κ dielectric such that the capping dielectric isolates the conductive rhodium-based nanoparticles from conductive elements, wherein the conductive rhodium-based nanoparticles are configured as charge traps.

19. The method of claim 18, wherein forming the rhodium in the conductive rhodium-based nanoparticles with a deposition time selected to attain a predetermined retention loss property includes forming the rhodium in the conductive rhodium-based nanoparticles with a deposition time selected corresponding to a retention loss property of 1 volt or less at 150° C. at 24 hrs.

20. The method of claim 18, wherein forming a high-κ dielectric on the substrate includes forming a $HfO_x$ dielectric.

21. The method of claim 18, wherein forming conductive rhodium-based nanoparticles includes forming rhodium nanoparticles and oxidizing the formed rhodium nanoparticles.

22. The method of claim 18, wherein forming conductive rhodium-based nanoparticles includes forming a rhodium nanoparticle with rhodium oxide covering the formed rhodium nanoparticle.

23. The method of claim 18, the method comprises controlling deposition times of rhodium in a plasma enhanced chemical vapor deposition such that the formed conductive rhodium-based nanoparticles have a density based on the controlled deposition times.

24. A method comprising:
forming a dielectric stack on a substrate;

after forming the dielectric stack, forming conductive rhodium-based nanoparticles on the formed dielectric stack including forming the rhodium in the conductive rhodium-based nanoparticles with a deposition time selected to attain a predetermined retention loss property, the conductive rhodium-based nanoparticles formed by a plasma-assisted deposition process such that each conductive rhodium-based nanoparticle is isolated from the other conductive rhodium-based nanoparticles;

after forming the conductive rhodium-based nanoparticles, forming a capping dielectric on and contacting the formed conductive rhodium-based nanoparticles and contacting the dielectric such that the capping dielectric isolates the conductive rhodium-based nanoparticles from conductive elements, wherein the conductive rhodium-based nanoparticles are configured as charge traps; and forming a conductive element over the capping dielectric, the conductive element arranged such that the conductive element operatively controls the conductive rhodium-based nanoparticles as charge storage elements.

25. The method of claim 24, wherein forming the rhodium in the conductive rhodium-based nanoparticles with a deposition time selected to attain a predetermined retention loss property includes forming the rhodium in the conductive rhodium-based nanoparticles with a deposition time selected corresponding to a retention loss property of 1 volt or less at 150° C. at 24 hrs.

26. The method of claim 24, wherein forming a dielectric stack includes forming a $HfO_x$ layer.

27. The method of claim 24, wherein forming a dielectric stack includes forming a silicon oxide layer.

28. The method of claim 24, wherein forming a dielectric stack includes forming the dielectric stack as a nanolaminate.

29. The method of claim 24, wherein forming conductive rhodium-based nanoparticles includes forming rhodium nanoparticles without rhodium oxide in the charge storage elements.

30. The method of claim 24, wherein forming conductive rhodium-based nanoparticles includes forming rhodium oxide.

* * * * *